United States Patent [19]

Thakkar

[11] 4,435,833
[45] Mar. 6, 1984

[54] FADE CONTROL CIRCUIT FOR AUXILIARY AMPLIFIER

[75] Inventor: Narendra C. Thakkar, Roselle, Ill.

[73] Assignee: International Jensen Incorporated, Schiller Park, Ill.

[21] Appl. No.: 384,404

[22] Filed: Jun. 2, 1982

[51] Int. Cl.³ .............................................. H03G 3/02
[52] U.S. Cl. ................................................... 381/109
[58] Field of Search ...................... 369/3; 381/109, 24, 381/61, 104, 120, 123

[56] References Cited

U.S. PATENT DOCUMENTS 4,164,625 8/1979 Igeta ............................... 179/1 G X Primary Examiner—A. D. Pellinen
Assistant Examiner—James L. Dwyer
Attorney, Agent, or Firm—Willian, Brinks, Olds, Hofer, Gilson & Lione

[57] ABSTRACT

A sound reproduction system is disclosed which includes a main amplifier which drives two main speakers via a fader control. An auxiliary speaker powered by an auxiliary amplifier is coupled to the sound reproduction system in such a way that the loudness ratio between one of the two main speakers and the auxiliary speaker remains constant, regardless of the setting of the fader control, and the loudness between the front main speaker and auxiliary speaker can be balanced. In one embodiment, the auxiliary amplifier is coupled to a voltage divider circuit, which is in turn coupled in parallel with the rear main speaker. In a second embodiment, the auxiliary amplifier is coupled via a variable resistor to a preamplifier which is coupled in parallel with the main amplifier. The variable resistor is mechanically coupled to the fader control such that manual adjustment of the fader control automatically adjusts the variable resistor to cause the variable resistor to track the fader control.

9 Claims, 2 Drawing Figures

FADE CONTROL CIRCUIT FOR AUXILIARY AMPLIFIER

BACKGROUND OF THE INVENTION

This invention is directed to a fade control circuit for use with an auxiliary amplifier, which allows power distribution to the auxiliary amplifier to be varied automatically in unison with power distribution to front speakers included in a sound reproduction system.

In modern automotive sound reproduction systems it is often desirable to use a main amplifier to drive front and rear main loudspeakers, and an auxiliary amplifier to drive an auxiliary rear speaker. Such systems have the advantage of increased power and reduced distortion as compared with commonly available single amplifier systems. It is also conventional to provide a fader control to control the distribution of power between the front and rear main speakers. The fader control can be used to balance the loudness of the front main speaker with respect to the rear main speaker to achieve the desired power distribution.

However, in the past it has been common practice to run the auxiliary amplifier and the auxiliary rear speaker at a power distribution which is independent of the setting of the fader control. Such an arrangement provides the disadvantage that the loudness of the auxiliary speaker can serve to reduce the effective range of adjustability of the front-rear loudness ratio, in that the loudness of the auxiliary rear speaker is not adjusted by the fader control. Thus, power distribution to the auxiliary rear speaker can effectively prevent extremely high front to rear power ratios.

SUMMARY OF THE INVENTION

The present invention is directed to an improved sound reproduction system which includes means for automatically varying the power distribution to an auxiliary rear speaker, in unison with the power distribution to the rear main speaker such that a single adjustment is sufficient both to control the balance between the front and rear main speakers, and to retain the power distribution between the auxiliary rear speaker and the rear main speaker at a desired, preselected value. Two embodiments of the invention are disclosed below, one of which employs a fader control variable resistor and a voltage divider, and the other of which employs a fader control variable resistor and a variable resistor.

An important advantage of this invention is that it markedly simplifies the operation of a sound reproduction system which includes an auxiliary amplifier and speaker. This invention preserves a preselected balance between the loudness of the auxiliary speaker and the loudness of the rear main speaker, while allowing the loudness ratio between the front main speaker and the two rear speakers to be adjusted as desired.

The invention itself, together with further objects and attendant advantages, will best be understood by reference to the following detailed description taken in conjunction with the accompanying drawings.

DETAILED DESCRIPTION OF THE PRESENTLY PREFERRED EMBODIMENTS

Figure 1:
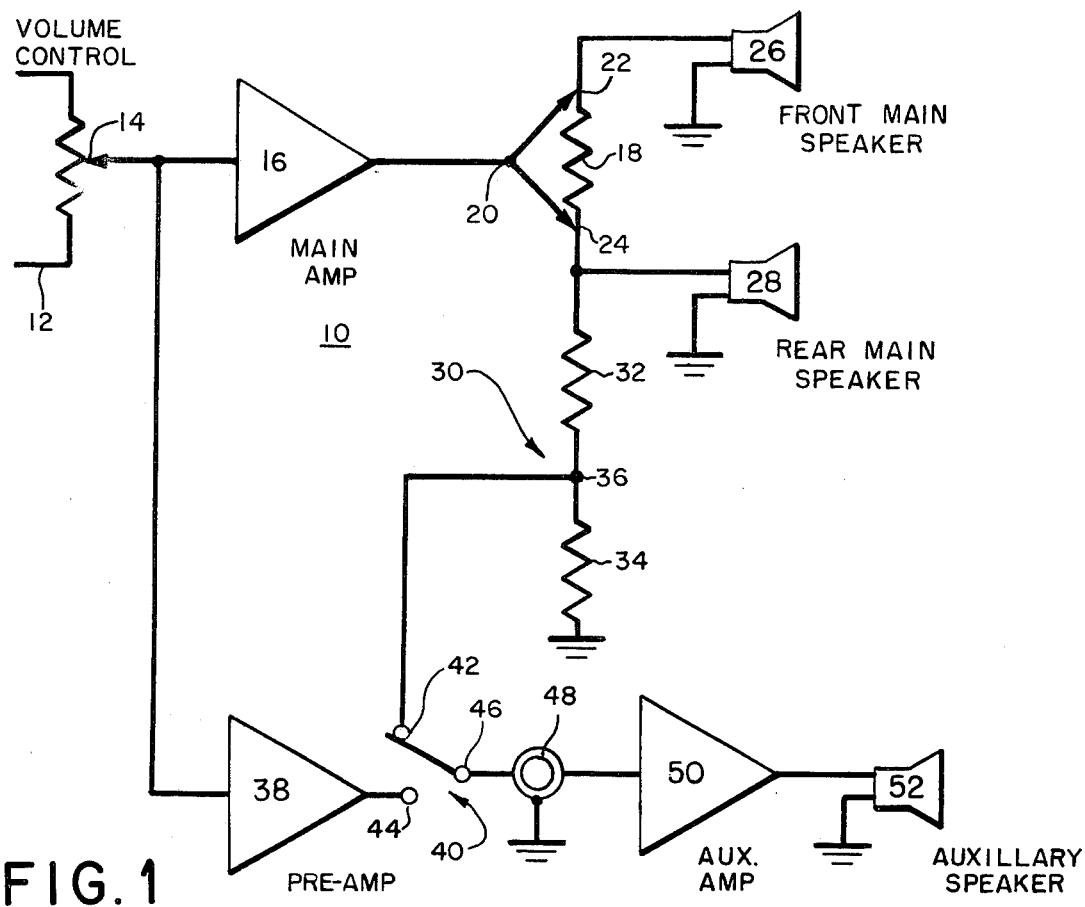
FIG. 1 is a block diagram of a sound reproduction system which incorporates a first preferred embodiment of this invention.

Turning now to the drawings, FIG. 1 provides a block diagram of a sound reproduction system 10 which incorporates a first preferred embodiment of this invention. In FIG. 1, the reference numeral 12 is used to indicate a conventional volume control. This volume control 12 includes a volume control wiper 14 which carries a signal indicative of the desired audio signal to be amplified and broadcast by the system. The audio signal on the wiper 14 is applied as an input to a main amplifier 16 which serves to amplify the input signal and to apply the amplified signal to a common terminal 20 of a fader control variable resistor 18. This variable resistor 18 includes two terminals 22,24, each of which is connected to a respective one of the front and rear main speakers 26,28.

The fader control variable resistor 18 is a dual wiper variable resistor which is continuously variable over a range of adjustability. In the central position shown in FIG. 1, a low resistance connection is made between the common terminal 20 and both of the terminals 22,24. In this position, the full power of the main amplifier is applied equally to the front and rear main speakers 26,28. When the fader control variable resistor 18 is adjusted to alternate positions, one of the two terminals 22,24 remains in low resistance contact with the common terminal 20. The other terminal 22,24 is connected to the common terminal 20 via a variable resistor, the resistance of which varies as a function of the angular setting of the input shaft of the fader control variable resistor 18. By appropriately rotating this input shaft (not shown) a selectable resistance in the range of zero to 50 ohms can be placed between either of the front and rear main speakers 26,28 and the main amplifier 16. Such fader control variable resistors 18 are well known to the art and are commonly sold by a number of manufacturers. For example, the variable resistor 18 can be a resistor such as that sold by Alps of Japan.

The terminal 24 associated with the rear main speaker 28 is coupled to a voltage divider 30 which comprises two resistors 32,34 coupled at a node 36. In this preferred embodiment, the resistors 32,34 are 27 ohm and 4.7 ohm resistors, respectively. Resistor 32 in this embodiment is a one watt resistor, and resistor 34 in this embodiment is a one-half watt resistor. The node 36 of the voltage divider 30 is coupled to a switched terminal 42 of a double pole, double throw switch 40.

A preamplifier 38 has an input terminal coupled to the wiper 14 of the volume control 12, in parallel with the main amplifier. The amplified output of this preamplifier 38 is coupled to a second switched terminal 44 of the switch 40. The common terminal 46 of this switch 40 is coupled via a connector 48 to an input terminal of an auxiliary amplifier 50. This auxiliary amplifier 50 is coupled to drive an auxiliary speaker 52, which in this embodiment is located to the rear of the front main speaker 26.

The switch 40 is used to disconnect the auxiliary amplifier 50 from the voltage divider 30 and to connect it with the preamplifier 38 when it is desired to use the preamplifier 38 to render the auxiliary amplifier 50 and the auxiliary speaker 52 independent of the fader control variable resistor 18.

The main amplifier 16, the preamplifier 38, the auxiliary amplifier 50, and the speakers 26,28,52 are conventional components which can vary widely, depending on the individual application. It will be understood that the present invention is not directed to any of these components per se, and that the detailed structure of these components will, therefore, not be described here. However, power integrated circuits, such as integrated circuit TA 724OP, can be used for the main amplifier 16, a transistor such as 2SC536F can be used for the preamplifier 38, any suitable auxiliary amplifier such as Jensen amplifier Type A30 can be used for the auxiliary amplifier 50, and any suitable speaker such as 4-ohm speakers can be used for three speakers 26,28,52. It will be understood that the circuit shown in FIG. 1 is representative of only one of two channels of a stereo sound reproduction system. The other channel is, in all respects, similar to that shown in FIG. 1.

The embodiment of FIG. 1 requires only one active control, the fader control variable resistor 18, to perform the desired function of maintaining the auxiliary speaker 52 in balance with the rear main speaker 28, while allowing the balance between the front main speaker 26 on the one hand, and the rear main speaker 28 and the auxiliary speaker 52 on the other hand, to be varied as desired. The characteristics of the voltage divider 30 determine the ratio of loudness between the rear main speaker 28 and the auxiliary speaker 52, and also the balance of loudness between front main speaker 26 and auxiliary speaker 52, while the fader control variable resistor 18 determines the balance of loudness between the front speaker 26 and the two rear speakers 28,52. The embodiment of FIG. 1 is particularly advantageous in applications where the power of the main amplifier 16 is comparable to that of the auxiliary amplifier 50.

Another important advantage of the embodiment of FIG. 1 is that the main amplifier 16, the preamplifier 38, the fader control variable resistor 18, the voltage divider 30, the switch 40, and the connector 48 can all be mounted in a single unit suitable for mounting in the dashboard of a car. When so mounted, only the three speakers and the auxiliary amplifier need be mounted separately.

Figure 2:
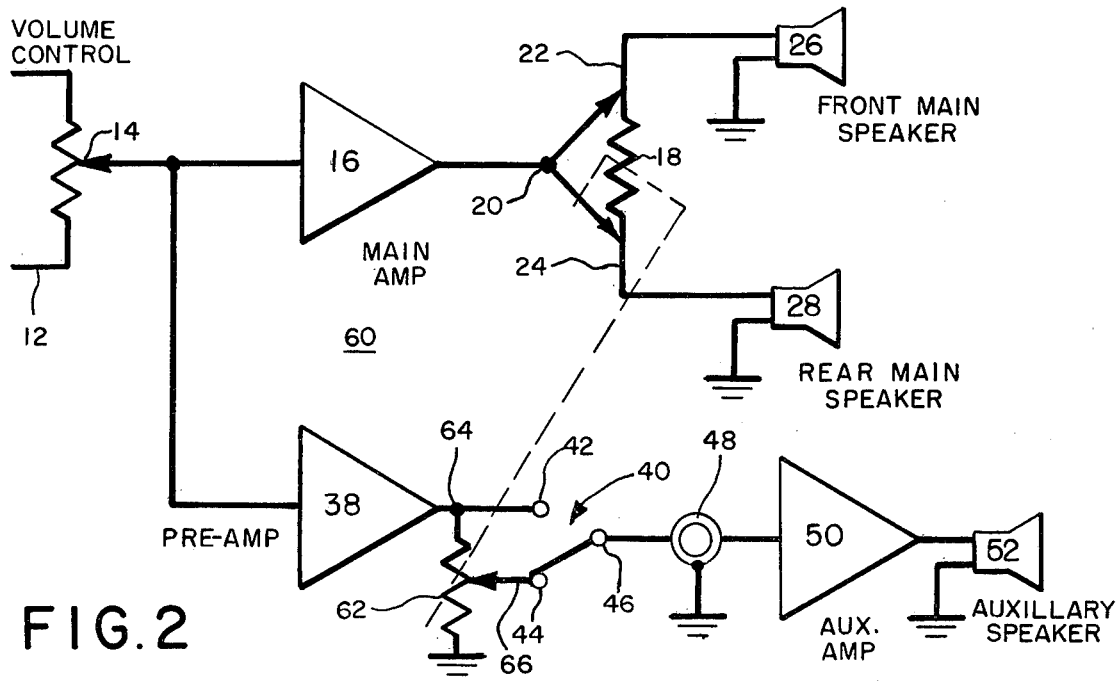
FIG. 2 is a block diagram of a sound reproduction system incorporates a second preferred embodiment of this invention.

Turning now to FIG. 2, a second preferred embodiment 60 is similar in many respects to the first preferred embodiment 10 of FIG. 1. Individual components of FIG. 2 which correspond to previously discussed components of FIG. 1 have been identified by the same reference numerals as those used in FIG. 1 and will not, therefore, be described in detail here.

In the embodiment of FIG. 2, the switched terminal 42 of the switch 40 is coupled directly to the output of the preamplifier 38, and the switched terminal 44 of the switch 40 is coupled to the wiper 66 of a variable resistor 62. A second terminal 64 of the variable resistor 62 is coupled to the first switched terminal 42. Thus, when the switch 40 is in the position shown in FIG. 2, the position of the wiper 66 determines the resistance interposed between the output of the preamplifier 38 and the common terminal 46 of the switch 40.

As indicated by dotted lines in FIG. 2, the variable resistor 62 is mechanically coupled to the fader control variable resistor 18 such that the two variable resistors 18,62 move in unison. This can be done, for example, by mounting the variable resistor 62 on the same shaft as the fader control variable resistor 18 such that the same manual input serves to adjust both variable resistors 18,62. The mechanical linkage between the two variable resistors 62,18 should be chosen such that the resistance between the terminal 64 and the wiper 66 of the variable resistor 62 is maintained at a predetermined fraction of the resistance between the common terminal 20 and the terminal 24 of the fader control variable resistor 18 coupled to the rear main speaker 28. This ensures that the ratio between the loudness of the auxiliary speaker 52 and the loudness of the rear main speaker 28 remains at a fixed predetermined value.

The embodiment of FIG. 2 provides the advantage that the preamplifier 38 is effectively used whenever an auxiliary amplifier 50 is in use. Furthermore, the variable resistor 62 is interposed between the preamplifier 38 and the auxiliary amplifier 50, thereby reducing power dissipation as compared with the embodiment of FIG. 1. The embodiment of FIG. 2 allows effective fader control of all three speakers, regardless of the ratio between the power of the auxiliary amplifier 50 and that of the main amplifier 62.

From the foregoing, it should be apparent that two embodiments of an improved sound reproduction system have been disclosed, both of which allow a single manual control to be used to control the power distribution between one front main speaker and two or more rear speakers, at least one of which is powered by an auxiliary amplifier. The disclosed embodiments are low-cost in manufacture, are small in size requirements, and are reliable in use. They provide important new features and modes of operations at small incremental cost.

Of course, it should be understood that various changes and modifications to the preferred embodiments described above will be apparent to those skilled in the art. For example, alternative amplifiers and speakers may be substituted for those disclosed above, and the particular values and wattages of resistors can be modified to suit individual applications. It is, therefore, intended that the foregoing detailed description be regarded as illustrative rather than as limiting, and that it be understood that it is the following claims, including all equivalents, which are intended to define the scope of this invention.

I claim:

1. In a second reproduction system comprising a signal source, a main amplifier coupled to the signal source, first and second main speakers, an auxiliary amplifier, and an auxiliary speaker coupled to and driven by the auxiliary amplifier, the improvement comprising:
    a fader control variable resistor having a first terminal coupled to the main amplifier, a second terminal coupled to the first main speaker, and a third terminal coupled to the second main speaker, said fader control variable resistor comprising means for selectively varying the resistance between the first and second terminals and between the first and third terminals in order to control the power distribution between the first and second main speakers;
    a voltage divider coupled to the second terminal of the fader control variable resistor, said voltage divider having an intermediate node coupled to an input terminal of the auxiliary amplifier such that power distribution to the auxiliary speaker is proportional to power distribution to the first main speaker.

2. The invention of claim 1 wherein the first main speaker and the auxiliary speaker are rear speakers and the second main speaker is a front speaker.

3. The invention of claim 1 further comprising:
a preamplifier coupled to the signal source; and
a double pole, double throw switch having a common terminal coupled to the input terminal of the auxiliary amplifier, a first switched terminal coupled to the intermediate node of the voltage divider, and a second switched terminal coupled to the preamplifier.

4. In a sound reproduction system comprising a signal source, a main amplifier coupled to the signal source, first and second main speakers, an auxiliary amplifier, an auxiliary speaker coupled to and driven by the auxiliary amplifier, and a preamplifier coupled to the signal source, the improvement comprising:
a fader control variable resistor having a first terminal coupled to the main amplifier, a second terminal coupled to the first main speaker, and a third terminal coupled to the second main speaker, said fader control variable resistor comprising means for selectively varying the resistance between the first and second terminals and between the first and third terminals in order to control the power distribution between the first and second main speakers;
an auxiliary variable resistor having a first terminal coupled to the preamplifier and a second terminal coupled to an input terminal of the auxiliary amplifier, said auxiliary variable resistor comprising means for selectively varying the resistance between the first and second terminals of the auxiliary variable resistor to control the signal level applied to the auxiliary amplifier;
said auxiliary variable resistor coupled to the fader control variable resistor by means of a single manual control such that adjustment of the manual control simultaneously adjusts the two variable resistors, thereby causing power distribution to the auxiliary speaker to remain proportional to power distribution to one of the first and second main speakers.

5. The invention of claim 4 wherein the auxiliary speaker and said one of the first and second main speakers are rear speakers and the other of the first and second main speakers is a front speaker.

6. The invention of claim 4 further comprising a double pole, double throw switch having a common terminal coupled to the input terminal of the auxiliary amplifier and first and second switched terminals coupled to the first and second terminals of the auxiliary variable resistor, respectively.

7. In a sound reproduction system comprising a signal source, a main amplifier coupled to the signal source, first and second main speakers, an auxiliary amplifier, and an auxiliary speaker coupled to and driven by the auxiliary amplifier, the improvement comprising:
a fader control variable resistor having a first terminal coupled to the main amplifier, a second terminal coupled to the first main speaker, and a third terminal coupled to the second main speaker, said fader control variable resistor comprising means for selectively varying the resistance between the first and second terminals and between the first and third terminals in order to control the power distribution between the first and second main speakers; and
means for supplying an input signal to the auxiliary amplifier which is proportional to the signal supplied to the first main speaker throughout the range of adjustment of the fader control variable resistor such that the loudness of the auxiliary speaker tracks that of the first main speaker.

8. The invention of claim 7 wherein the supplying means comprises a voltage divider connected between the first main speaker and the auxiliary amplifier.

9. The invention of claim 7 wherein the supplying means comprises a variable resistor, connected between the auxiliary amplifier and a pre-amplifier coupled to the signal source, and coupled to the fader control variable resistor to move in unison therewith.

* * * * *

UNITED STATES PATENT AND TRADEMARK OFFICE
CERTIFICATE OF CORRECTION

PATENT NO. : 4,435,833
DATED : March 6, 1984
INVENTOR(S) : Narendra C. Thakkar

It is certified that error appears in the above-identified patent and that said Letters Patent is hereby corrected as shown below:

ON THE FRONT PAGE OF THE PATENT IN THE ABSTRACT

Line 6, please delete "one of the two main speakers", and substitute therefor --the rear main speaker--.

IN THE PATENT SPECIFICATION

Column 2, line 2, please delete "system incorporates" and substitute therefor --system which incorporates--;

Column 3, line 14, please delete "for three" and substitute therefor --for the three--;

IN THE CLAIMS

Column 4, Claim 1, line 46, please delete "second", and substitute therefor --sound--.

Signed and Sealed this

Twelfth Day of November 1985

[SEAL]

Attest:

DONALD J. QUIGG

Attesting Officer

Commissioner of Patents and Trademarks